(12) United States Patent
Satou

(10) Patent No.: US 7,684,451 B2
(45) Date of Patent: Mar. 23, 2010

(54) OPTICAL TRANSMITTER MODULE FOR STABILIZING OPTICAL OUTPUT POWER AND WAVELENGTH

(75) Inventor: Shigenori Satou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 140 days.

(21) Appl. No.: 11/843,715

(22) Filed: Aug. 23, 2007

(65) Prior Publication Data

US 2008/0049798 A1 Feb. 28, 2008

(30) Foreign Application Priority Data

Aug. 24, 2006 (JP) ............................. 2006-228296

(51) Int. Cl.
*H01S 3/00* (2006.01)
*G02B 27/14* (2006.01)
(52) U.S. Cl. ........................ 372/29.02; 372/32; 359/629
(58) Field of Classification Search ......... 372/29.02–32
See application file for complete search history.

(56) References Cited

U.S. PATENT DOCUMENTS

| 5,781,572 | A | 7/1998 | Tahara et al. | |
| 6,178,002 | B1 * | 1/2001 | Mueller-Wirts | 356/491 |
| 6,597,712 | B2 * | 7/2003 | Tatsuno et al. | 372/32 |
| 6,711,188 | B2 | 3/2004 | Ito et al. | |
| 2002/0075912 | A1 | 6/2002 | Ito et al. | |
| 2002/0126717 | A1 * | 9/2002 | Nasu et al. | 372/32 |
| 2004/0130762 | A1 * | 7/2004 | Thomas et al. | 359/15 |
| 2005/0094295 | A1 * | 5/2005 | Yamashita et al. | 359/833 |

FOREIGN PATENT DOCUMENTS

| JP | 6349100 | 12/1994 |
| JP | 2601805 | 1/1997 |
| JP | 9121070 | 5/1997 |
| JP | 2002185075 | 6/2002 |

* cited by examiner

*Primary Examiner*—Minsun Harvey
*Assistant Examiner*—Phillip Nguyen
(74) *Attorney, Agent, or Firm*—Young & Thompson

(57) ABSTRACT

An optical transmitter module includes a semiconductor laser for outputting forward outgoing light and backward outgoing light, a temperature control device for controlling a temperature of the semiconductor laser, a beam splitter plate for receiving incidence of the backward outgoing light and outputting split light, which is reflected part of the backward outgoing light and transmitted light, which is part of the backward outgoing light, a first photoelectric conversion element for converting the split light into an electric signal. The beam splitter plate includes an anti-stray-light structure for preventing the transmitted light reflected by an incident surface of a wavelength filter from entering the first photoelectric conversion element through a side end surface portion of the beam splitter plate.

19 Claims, 12 Drawing Sheets

Fig. 9A
Fig. 9B
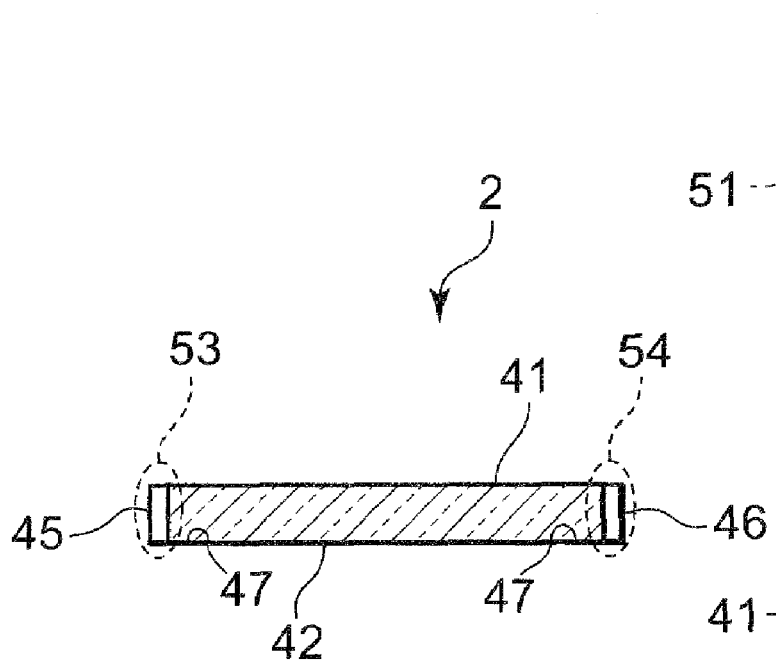
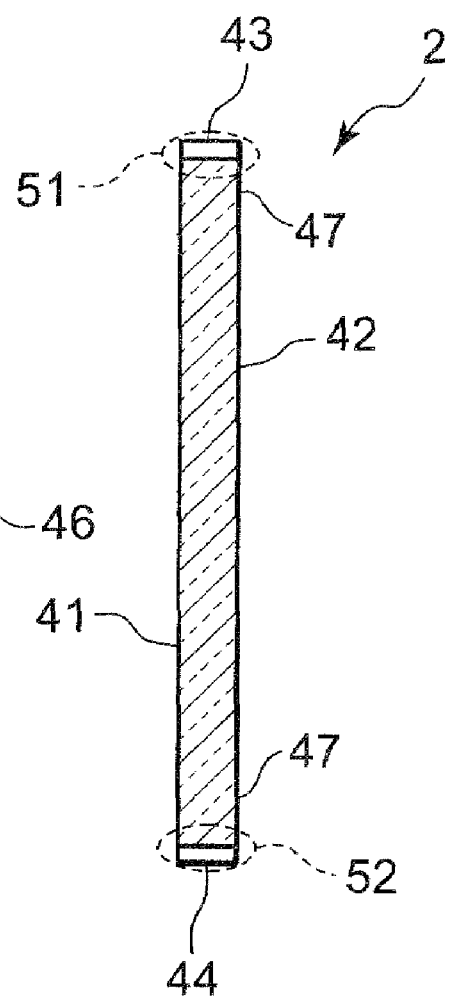

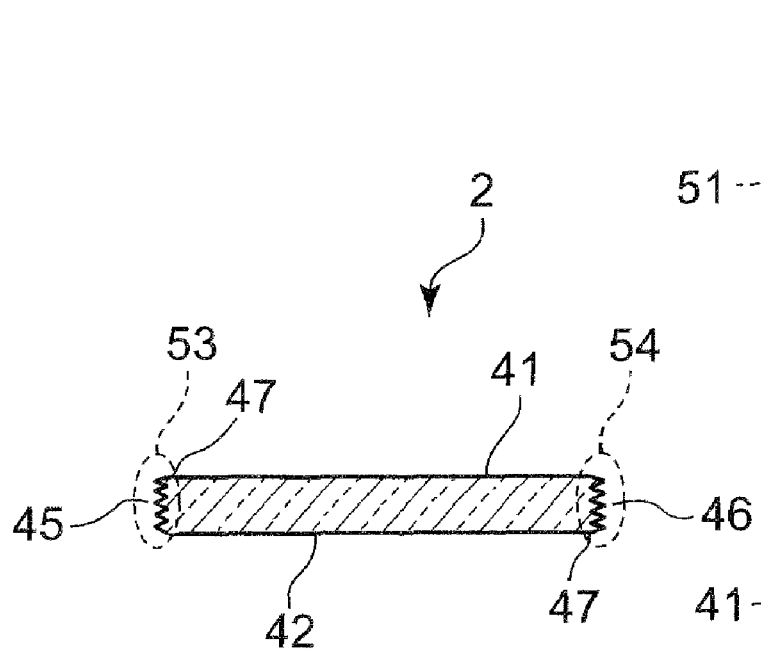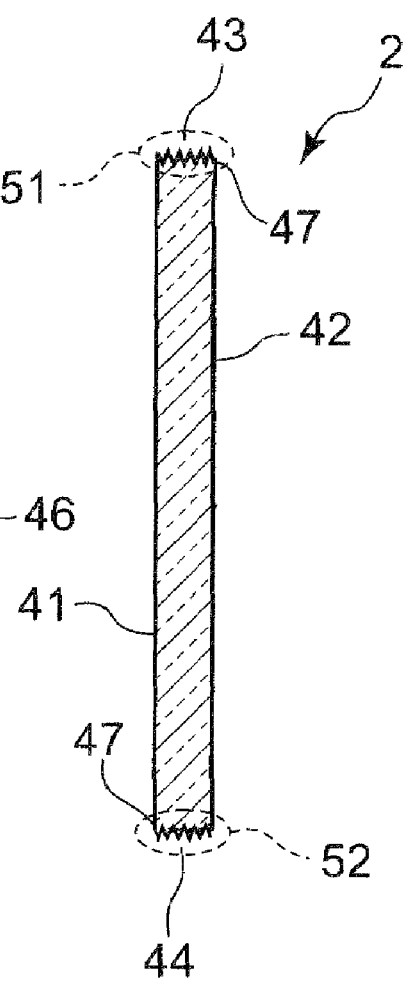

though the DFB laser oscillates at a single wavelength, the oscillation wavelength fluctuates depending on the temperature of the semiconductor laser or on an operating current. Moreover, it is also important to achieve constant output intensity of the light source in the optical fiber communication system. For this reason, a conventional optical fiber communication system performs control for achieving the constant temperature of the semiconductor laser and the constant optical output. Basically, the oscillation wavelength and the optical output are maintained constant with a constant temperature of the semiconductor and a constant injection current thereto. However, because of the characteristic deterioration due to the long use of the semiconductor laser, the operating current is increased in order to maintain the constant optical output, which leads to fluctuations in the oscillation wavelength. Nevertheless, the fluctuations in the oscillation wavelength are minimal and are therefore negligible in the conventional optical fiber communication system.

OPTICAL TRANSMITTER MODULE FOR STABILIZING OPTICAL OUTPUT POWER AND WAVELENGTH

FIELD OF THE INVENTION

The present invention relates to an optical transmitter module. More specifically, the present invention relates to an optical transmitter module stabilizing output power and the wavelength of a laser beam emitted from a laser.

DESCRIPTION OF RELATED ART

A semiconductor laser is used as a light source for an optical fiber communication system. In particular, a semiconductor laser such as a distributed feed back (DFB) laser configured to oscillate in a single longitudinal mode is used for optical fiber communication at a distance of several tens of kilometers or longer in order to suppress an effect of wavelength dispersion. Although the DFB laser oscillates at a single wavelength, the oscillation wavelength fluctuates depending on the temperature of the semiconductor laser or on an operating current. Moreover, it is also important to achieve constant output intensity of the light source in the optical fiber communication system. For this reason, a conventional optical fiber communication system performs control for achieving the constant temperature of the semiconductor laser and the constant optical output. Basically, the oscillation wavelength and the optical output are maintained constant with a constant temperature of the semiconductor and a constant injection current thereto. However, because of the characteristic deterioration due to the long use of the semiconductor laser, the operating current is increased in order to maintain the constant optical output, which leads to fluctuations in the oscillation wavelength. Nevertheless, the fluctuations in the oscillation wavelength are minimal and are therefore negligible in the conventional optical fiber communication system.

However, a semiconductor laser used in the system is required to achieve higher oscillation wavelength stability than a conventional one. This is because a dense wavelength division multiplexing (DWDM) transmission configured to guide numerous beams having different wavelengths into a single optical fiber has been becoming mainstream in the optical fiber communication systems in recent years along with increasing communication traffics. To achieve this requirement, there has been known a technique for stabilizing an oscillation wavelength and an optical output in the following manner. Specifically, a part of an output of a semiconductor laser is detected by an optical output monitoring photodiode (PD), and a part of the output is detected by a wavelength monitoring PD through a wavelength filter. Then, an operating current and an operating temperature of the semiconductor laser are controlled on the basis of photocurrent information detected by these two PDs. To achieve precise control, it is essential to increase photocurrent detection efficiency of the PDs and to reduce an influence of stray light that causes noises.

According to a technique disclosed in Japanese Patent Application Laid-open Publication No. 2002-185075, stabilizing the oscillation wavelength of a semiconductor laser by using two photodetectors disposed on the same plane can be achieved. Light transmitted through the wavelength filter enters one of those two photodetectors (a filter-transmitted light's side photodetector). Meanwhile, light emitted from the semiconductor laser directly enters the other one of the two photodetectors (an outgoing light's side photodetector). Moreover, the wavelength filter is provided with an anti-stray-light structure for preventing the light emitted from an end of the wavelength filter from entering the outgoing light's side photodetector as stray light.

According to a technique disclosed in Japanese Patent Application Laid-open Publication No. Hei 9(1997)-121070, an optical wavelength stabilizing system is configured to maintain a desired value of the emission wavelength of a laser diode to a desired wavelength by supplying split signal light that is formed by splitting signal light outputted from the laser diode, back power light of the laser diode, and the like to a photodiode (PD: a light receiving element) through an optical filter.

According to a technique disclosed in Japanese Unexamined Patent Laid-open Patent Publication No. Hei 6 (1994)-349100, a beam splitter has a specific surface formed like frosted glass, and split light which is split by the beam splitter is outputted as scattering light that does not negatively affect a photodetector. Meanwhile, Japanese Patent No. 2601805 discloses a technique with which a surface for receiving light outputted from a beam splitter is formed so as to reflect the light diffusely in order to suppress retroreflection of the light outputted from the beam splitter.

In the meantime, in a configuration in which split laser beam fluxes obtained by splitting backward output light with a beam splitter plate are caused to enter the wavelength monitoring PD and the optical output monitoring PD, all the split laser beam fluxes on one side enter the wavelength monitoring PD through the wavelength filter, while the split laser beam fluxes on the other side enter the optical output monitoring PD. Accordingly, no scattering light is generated by the wavelength filter and it is therefore possible to reduce the influence of stray light. Moreover, as the optical fluxes enters both of the PDs without scattering, this configuration has an advantage for securing sufficient coupling efficiency for the PDs, thereby obtaining high monitoring signal intensity.

Now, an optical transmitter module used in a conventional optical communication system will be described with reference to drawings. FIG. 1 is a cross-sectional view showing a configuration of an optical transmitter module 110 used in a conventional optical communication system. The conventional optical transmitter module 110 includes a signal light generator 125, a wavelength stabilizing unit 126, and a temperature detection thermistor 118. The signal light generator 125 is configured to supply signal light to an optical fiber 117 in response to forward outgoing light. The wavelength stabilizing unit 126 is configured to detect a wavelength of a laser beam emitted from a semiconductor laser 101 in response to backward outgoing light. Referring to FIG. 1, the signal light generator 125 includes a first coupling lens 107, an optical isolator 108, and a second coupling lens 109. The first coupling lens 107 converts the forward outgoing light emitted from the semiconductor laser 101 into a collimating beam and supplies the collimating beam to the optical isolator 108. The optical isolator 108 prevents the forward outgoing light outputted through the first coupling lens 107 from being reflected by the second coupling lens 109 and the like and returning to the first coupling lens 107. The second coupling lens 109 causes the forward outgoing light outputted through the optical isolator 108 to converge on a light receiving point of a connector 116.

Meanwhile, the wavelength stabilizing unit 126 includes a lens 106, a beam splitter plate 102, a first photodetector 123 having a first photoelectric conversion element 103, a filter 105, and a second photodetector 124 having a second photoelectric conversion element 104. The lens 106 converts the backward outgoing light into a collimating beam and outputs the collimating beam. The beam splitter plate 102 outputs split light that is formed by splitting the collimating beam and transmitted light that is transmitted through the collimating beam. The first photoelectric conversion element 103 provided on the first photodetector 123 receives the split light and outputs a signal current corresponding to the split light. The first photodetector 123 outputs an electric signal in response to the signal current supplied from the first photoelectric conversion element 103. The filter 105 filters the transmitted light outputted from the beam splitter plate 102 and supplies the transmitted light having a predetermined wavelength to the second photoelectric conversion element 104. The second photoelectric conversion element 104 provided on the second photodetector 124 receives the transmitted light supplied through the filter 105 and outputs a signal current corresponding to the transmitted light. The second photodetector 124 outputs an electric signal in response to the signal current supplied from the second photoelectric conversion element 104.

In the conventional optical transmitter module 110, the above-described multiple optical devices are disposed on a temperature control device 121 provided inside a housing 120. Moreover, these optical devices are controlled at a constant temperature by a function of a substrate 122.

FIG. 2 is a schematic graph showing an optical output monitoring current 141 outputted from the first photo detector 123 and a wavelength monitor current 142 outputted from the second photo detector 124 dependence on an oscillation wavelength of the semiconductor laser 101 shown in FIG. 1. A wavelength monitoring current 142 indicates a wavelength monitoring current that flows when the light is transmitted through an etalon-type wavelength filter, for example, and the transmitted light enters the second photoelectric conversion element 104.

The oscillation wavelength of the semiconductor laser 101 varies not only by the temperature of the semiconductor laser but also by changing an injection current to the semiconductor laser. In other words, the optical output of the semiconductor laser 101 varies depending on the injection current and the temperature of the semiconductor laser.

Here, consider a case in which the conventional optical transmitter module 110 adjusts the oscillation wavelength of the semiconductor laser 101 to a reference wavelength λ0 in accordance with the graph in FIG. 2 while maintaining the constant optical output. For example, an electric current value of the detected optical output monitoring current 141 is defined as a first current I1 while an electric current value of the wavelength monitoring current 142 is defined as a second current I2. In this case, it is possible to control the oscillation wavelength and the optical output at the same time by controlling the semiconductor laser so as to keep (the first current I1+the second current I2) and (the first current I1−the second current I2) constant.

Referring to FIG. 2, it is ideal if the optical output monitoring current 141 is a linear output (an output as indicated with a dotted line). However, in the conventional optical transmitter module, an unstable current may be outputted as shown in parts Q1 to Q4.

A factor for outputting such an unstable current will be described below with reference to a drawing. FIG. 3 is an enlarged cross-sectional view showing the wavelength stabilizing unit 126. Here, transmitted light 134 indicates the light which is transmitted through the beam splitter plate 102 and is then supplied to the filter 105. First reflected light 135 indicates reflected light which is the transmitted light 134 reflected by a first filter surface 111 of the filter 105. Second reflected light 136 indicates reflected light which is the first reflected light 135 that enters the beam splitter plate 102 and is reflected by a beam splitter plate end portion 115 of the beam splitter plate 102.

Referring to FIG. 3, in the conventional optical transmitter module 110, the second reflected light 136 entering the first photoelectric conversion element 103 originally provided for incidence of the split light which is split by the beam splitter plate 102. By the function of this second reflected light 136, the current outputted from the first photodetector 123 (the optical output monitoring current 141 in FIG. 2) does not form a liner output in response to the oscillation wavelength but includes unstable portions such as the parts Q1 to Q4.

It is possible to achieve highly accurate control of the oscillation wavelength if the optical output monitoring current 141 in the first photodetector 123 of the optical transmitter module 110 comes close to the straight line as indicated with the dotted line in FIG. 2. As shown in FIG. 3, waveforms of the above-mentioned parts Q1 to Q4 are generated as a consequence of an aspect that the reflected light from the first filter surface 111 of the filter 105 having a wavelength dependency of transmittance (i.e. a wavelength dependency of reflectance) is supplied to the beam splitter plate 102 in the form of the first reflected light 135, and the first reflected light 135 is reflected again by the beam splitter plate end portion 115 of the beam splitter plate 102 to form the second reflected light 136 which enters the first photoelectric conversion element 103. Moreover, these waveforms may also be generated as a consequence of an aspect that stray light toward the semiconductor laser containing multi-reflected light, which is reflected repeatedly inside the filter 105, is reflected by the beam splitter plate end portion 115 of the beam splitter plate 102 to form the second reflected light 136 as similar to the first reflected light 135, and the second reflected light enters the first photoelectric conversion element 103. As described above, destabilizing factors of the optical monitoring currents still remain in the conventional optical transmitter module 110. Particularly, along an increase in the capacity of the DWDM optical fiber communication system, an interval of the oscillation wavelength of the semiconductor laser used therein is becoming extremely narrow from 100 GHz down to 50 GHz or 25 GHz and a demand for the wavelength stability is becoming higher as a consequence. Therefore, these small destabilizing factors of the optical monitoring currents used as the light source may also cause a problem in stabilization of the oscillation wavelength.

SUMMARY

In one embodiment, there is provided an optical transmitter module including a semiconductor laser configured to output forward outgoing light and backward outgoing light, a temperature control device configured to control a temperature of the semiconductor laser, a beam splitter plate configured to receive the backward outgoing light and to output split light, which is reflected part of the backward outgoing light and transmitted light, which is transmitted part of the backward outgoing light, a first photoelectric conversion element configured to convert the split light into an electric signal, a wavelength filter configured to receive the transmitted light and to change transmittance continuously depending on a wavelength of the transmitted light, and a second photoelectric conversion element configured to receive filter-transmitted light transmitted through the wavelength filter and to convert the filter-transmitted light into an electric signal.

Here, the beam splitter plate includes an anti-stray-light structure configured to prevent the transmitted light reflected by an incident surface of the wavelength filter from entering the first photoelectric conversion element through a side end surface portion of the beam splitter plate.

The anti-stray-light structure of the beam splitter plate includes a side end surface of a predetermined shape. In this configuration, the reflected light from the wavelength filter is outputted to a different direction from a direction where the first photoelectric conversion element for optical output monitoring is located. Accordingly, an optical output monitoring current is stabilized by suppressing incidence of the reflected light on the first photoelectric conversion element for optical output monitoring.

In another embodiment, there is also provided an optical transmitter module including a semiconductor laser configured to output forward outgoing light and backward outgoing light, a beam splitter plate configured to output split light, which is reflected part of the backward outgoing light and transmitted light, which is transmitted part of the backward outgoing light, a first photoelectric conversion element configured to receive the split light and to output a first signal obtained by converting the split light into an electric signal, a second photoelectric conversion element configured to receive the transmitted light and to output a second signal obtained by converting the transmitted light into an electric signal, and a wavelength filter disposed between the second photoelectric conversion element and the beam splitter plate.

In this case, the wavelength filter preferably includes a first filter surface configured to receive the transmitted light and a second filter surface opposed to the first filter surface. Moreover, the beam splitter plate preferably includes a first beam splitter plate surface configured to receive the backward outgoing light, a second beam splitter plate surface configured to output the transmitted light transmitted through the beam splitter plate, and an end portion located respectively adjacent to the first beam splitter plate surface and the second splitter plate surface.

Here, the end portion receives the reflected light reflected by the first filter surface through the second beam splitter plate surface, and suppresses retroreflection of the reflected light toward a light-receiving surface of the first photoelectric conversion element.

Retroreflection of the light from the filter to the laser entering the photoelectric conversion element for optical output monitoring through a side end surface of a beam splitter plate can be reduced and minor fluctuation of an optical output monitoring current (an optical output monitoring signal) can be thereby reduced. In this way, it is possible to stabilize a wavelength monitoring characteristic and to stabilize an oscillation wavelength of a semiconductor laser.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 9A and 9B are cross-sectional views illustrating cross sections of the beam splitter plate of the third embodiment;

FIGS. 11A and 11B are cross-sectional views illustrating cross sections of a beam splitter plate of a fourth embodiment.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First Embodiment

Figure 4:
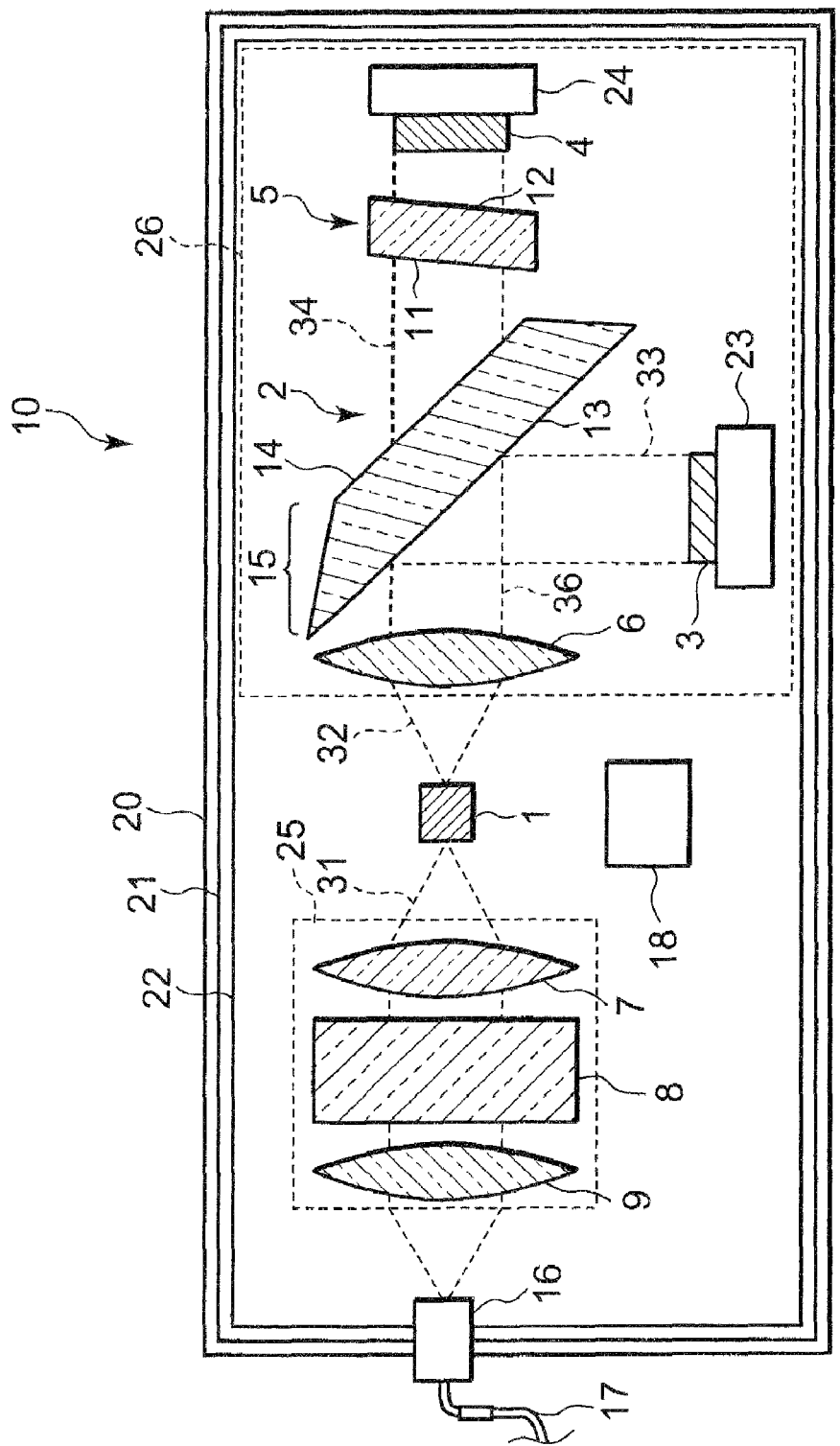
FIG. 4 is a cross-sectional view illustrating a configuration of an optical transmitter module applied to an optical communication system according to a first embodiment of the present invention.

Now, an embodiment of the present invention will be described with reference to the accompanying drawings. FIG. 4 is a cross-sectional view illustrating a configuration of an optical transmitter module 10 applied to an optical communication module of this embodiment. The optical transmitter module 10 of this embodiment includes a semiconductor laser 1 configured to diffusely emit forward outgoing light 31 and backward outgoing light 32, a signal light generator 25 configured to supply signal light to an optical fiber 17 in response to the forward outgoing light 31, a wavelength stabilizing unit 26 configured to detect a wavelength of a laser beam emitted from the semiconductor laser 1 in response to the backward outgoing light 32 and to stabilize the wavelength of the semiconductor laser beam, and a temperature detection thermistor 18. The optical transmitter module 10 of this embodiment is formed inside a housing 20. The semiconductor laser 1 is embedded on a temperature control device 21 provided with a substrate 22. The temperature of the semiconductor laser 1 can be controlled during operation by use of a function of the substrate 22.

Figure 1:
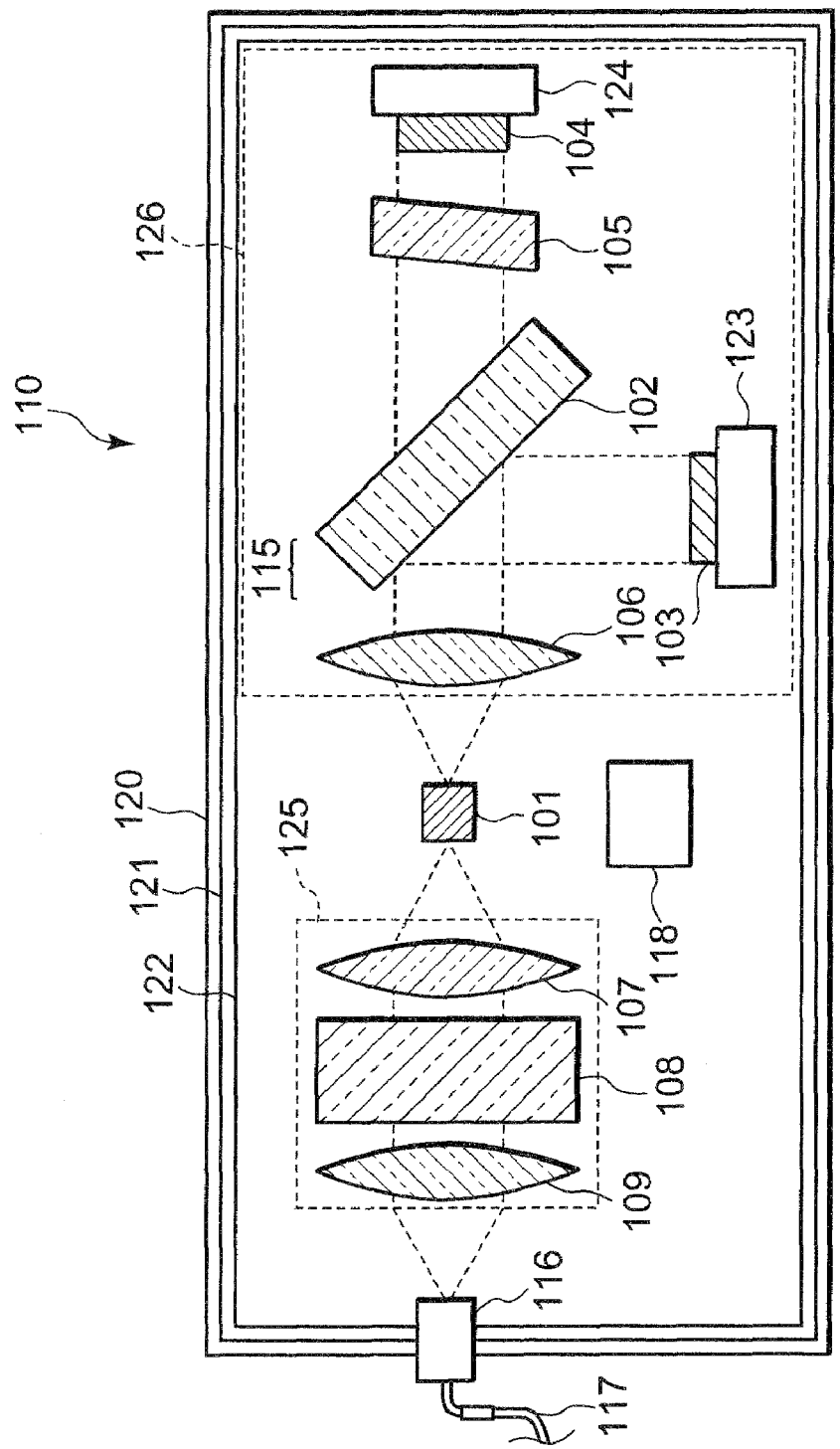
FIG. 1 is a cross-sectional view showing a configuration of a conventional optical transmitter module used in an optical communication system.

Referring to FIG. 4, the signal light generator 25 includes a first coupling lens 7, an optical isolator 8, and a second coupling lens 9. The first coupling lens 7 converts the forward outgoing light 31 emitted from the semiconductor laser 1 into a collimating beam and supplies the collimating beam to the optical isolator 8. The optical isolator 8 prevents the forward outgoing light 31 outputted through the first coupling lens 7 from being reflected by the second coupling lens 9 and the like and returning to the first coupling lens 7 and to the semiconductor laser 1. The second coupling lens 9 causes the forward outgoing light 31 outputted through the optical isolator 8 to converge on a light receiving point of a connector 16. The signal light generator 25 is incorporated in the housing 20. As shown in FIG. 1, the optical fiber 17 is connected to the housing 20 through the connector 16. The signal light generator 25 emits the signal light for optical communication through the optical fiber 17.

Meanwhile, the wavelength stabilizing unit 26 includes a lens 6, a beam splitter plate 2, a first photodetector 23 having a first photoelectric conversion element 3, a filter 5, and a second photodetector 24 having a second photoelectric conversion element 4. The lens 6 outputs the collimating backward outgoing light 36 which is formed by converting the backward outgoing light 32 into a collimating beam. A degree of parallelization of the collimating backward outgoing light 36 is preferably within a range from 2 degrees negative to 2 degrees positive. The beam splitter plate 2 outputs split light 33 which is formed by splitting (reflecting) the collimating backward outgoing light 36 with a first beam splitter plate surface 13. Moreover, the beam splitter plate 2 outputs transmitted light, which is transmitted part of the collimating backward outgoing light 36 therethrough, from a second beam splitter plate surface 14. The filter 5 includes a first filter surface 11 and a second filter surface 12. The first filter surface 11 receives transmitted light 34 outputted from the beam splitter plate 2. The beam splitter plate 2 filters a predetermined wavelength of the transmitted light 34 and supplies the transmitted light from the second filter surface 12 to the second photoelectric conversion element 4.

A first photodetection unit including the first photoelectric conversion element 3 and the first photodetector 23 is formed on the temperature control device 21. Similarly, a second photodetection unit including the second photoelectric conversion element 4 and the second photodetector 24 is formed on the temperature control device 21. The first photoelectric conversion element 3 provided on the first photodetector 23 receives the split light 33 and outputs a signal charge corresponding to the split light 33 to the first photodetector 23. The first photodetector 23 outputs a first electric signal in response to the signal charge supplied from the first photoelectric conversion element 3. The second photoelectric conversion element 4 provided on the second photodetector 24 receives the transmitted light 34 supplied through the filter 5 and outputs a signal charge corresponding to the transmitted light 34 to the second photodetector 24. The second photodetector 24 outputs a second electric signal in response to the signal charge supplied from the second photoelectric conversion element 4.

The wavelength stabilizing unit 26 outputs the first electric signal and the second electric signal to an arithmetic circuit (not shown). The arithmetic circuit detects variation in an optical output and variation in an oscillation wavelength of the semiconductor laser 1 by use of a sum of and a difference between the first electric signal and the second electric signal. In response to the detected variation, the arithmetic circuit outputs a control signal so as to set the second electric signal to a given value to be determined by desired optical output. Moreover, in response to the detected variation, the arithmetic circuit outputs a control signal so as to set the second electric signal to a given value to be determined by a reference wavelength λ0 representing a stabilization target. The control signals are continuously fed back to at least one of an injection current control device (not shown) for controlling an injection current to the semiconductor laser 1 and the temperature control device 21 for controlling the temperature of the semiconductor laser 1. In this way, the wavelength stabilizing unit 26 stabilizes the optical output and the oscillation wavelength of the semiconductor laser 1.

As described above, the semiconductor laser 1, the signal light generator 25, the wavelength stabilizing unit 26, and the temperature detection thermistor 18 are formed on the temperature control device 21 provided with the substrate 22. Therefore, these optical components provided on the temperature control device 21 are controlled at a constant temperature by the function of the substrate 22.

The filter 5 is placed obliquely (so as not to be parallel) to a plane which is orthogonal to an optical axis of the backward outgoing light 32 (such a plane will be hereinafter referred to as a reference plane 37) in order to avoid retroreflection of the light to an exit point, namely, the semiconductor laser 1. Here, it is also possible to place the second photoelectric conversion element 4 provided in the second photodetection unit obliquely (so as not to be parallel) to the reference plane 37 in order to avoid retroreflection of the light to the semiconductor laser 1.

Referring to FIG. 4, the beam splitter plate 2 includes a beam splitter plate end portion 15. The beam splitter plate end portion 15 has a structure to prevent the reflected light from the first filter surface 11 of the filter 5 from being reflected again by the beam splitter plate end portion 15 and entering the first photoelectric conversion element 3. Moreover, the beam splitter plate end portion 15 has a structure to prevent stray light toward the semiconductor laser containing multi-reflected light, which is reflected repeatedly inside the filter 5, from being reflected by the beam splitter plate end portion 15 of the beam splitter plate 2 and entering the first photoelectric conversion element 3.

Figure 5:
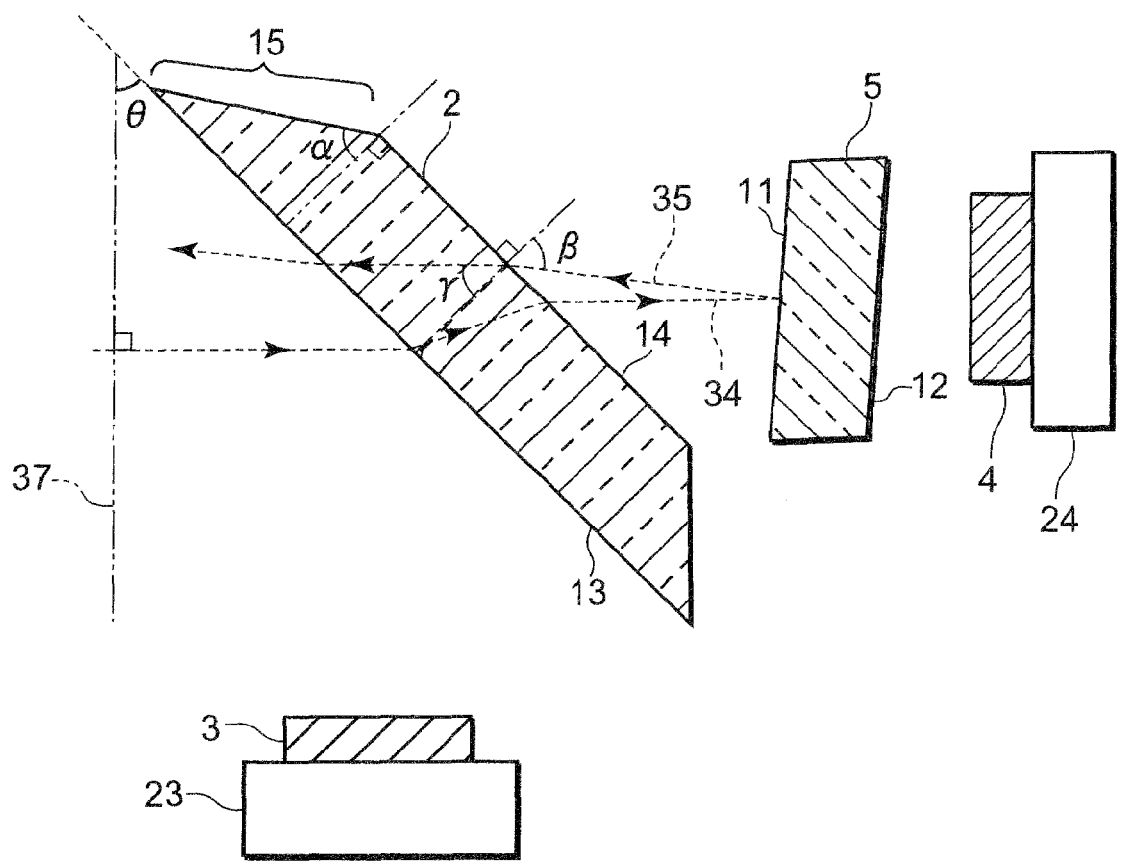
FIG. 5 is a cross-sectional view illustrating a detailed configuration of a wavelength stabilizing unit in this embodiment.

Now, the detailed configuration of the wavelength stabilizing unit 26 of this embodiment will be described below. FIG. 5 is a cross-sectional view illustrating the detailed configuration of the wavelength stabilizing unit 26 of this embodiment. As described previously, the beam splitter plate 2 includes the first beam splitter plate surface 13 and the second beam splitter plate surface 14. Referring to FIG. 5, the beam splitter plate 2 of this embodiment is designed such that an angle of the first beam splitter plate surface 13 relative to the reference plane 37 is formed into a layout angle θ. Meanwhile, the second beam splitter end portion 15 of the beam splitter plate 2 of this embodiment is formed of a plane that defines a first angle α with a perpendicular plane to the second beam splitter plate surface 14.

In this case, assuming that an incident angle of reflected light 35 reflected by the first filter surface 11 of the filter 5 entering the second beam splitter plate surface 14 of the beam splitter plate 2 is a second angle β and an exit angle of reflected light 35 reflected by the first filter surface 11 of the filter 5 exiting from the first beam splitter plate surface 13 is a third angle γ, the beam splitter plate end portion 15 of the beam splitter plate 2 is configured to satisfy γ<α<90°.

Figure 2:
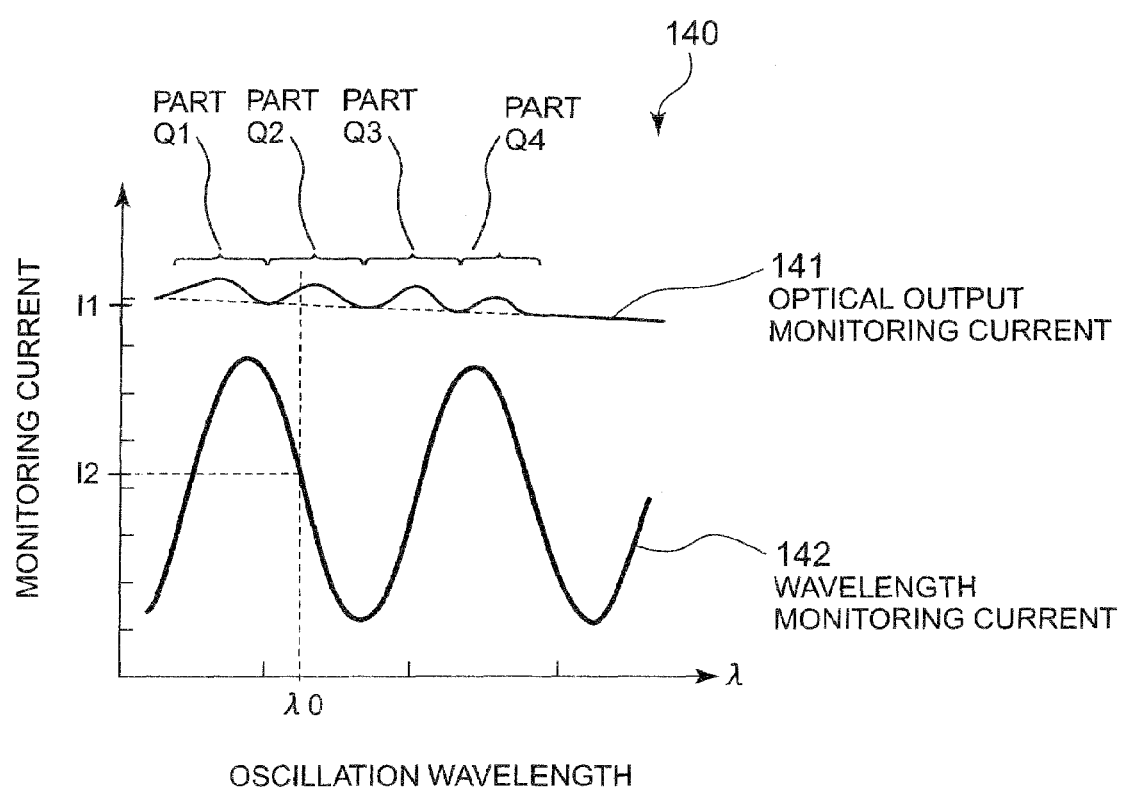
FIG. 2 is a graph showing correspondence between an oscillation wavelength of a semiconductor laser and monitoring currents in the conventional optical transmitter module.
Figure 3:
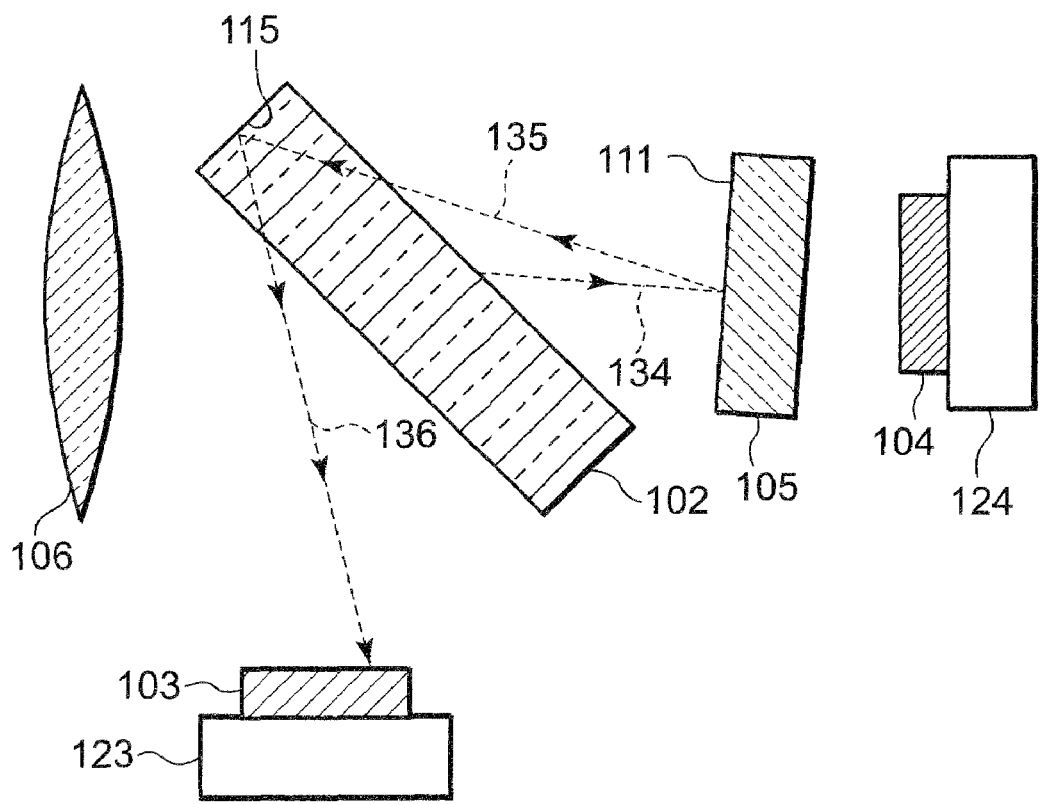
FIG. 3 is a cross-sectional view showing a wavelength stabilizing unit.

By providing the beam splitter plate end portion 15 of the beam splitter plate 2 as shown in FIG. 5, the reflected light 35 supplied from the first filter surface 11 of the filter 5 is outputted to a different direction from the direction where the first photoelectric conversion element 3 is located. In this way, it is possible to suppress the reflected light toward the first photoelectric conversion element 3 for optical output monitoring and thereby to stabilize an optical output monitoring current. Specifically, it is possible to suppress generation of unstable portions (such as the parts Q1 to Q4 in FIG. 2) contained in the conventional optical output monitoring current, and thereby to output a liner optical output monitoring current. Therefore, the oscillation wavelength of the semiconductor laser 1 of this embodiment can be controlled at higher accuracy than the conventional optical transmitter module 110.

Second Embodiment

Figure 6:
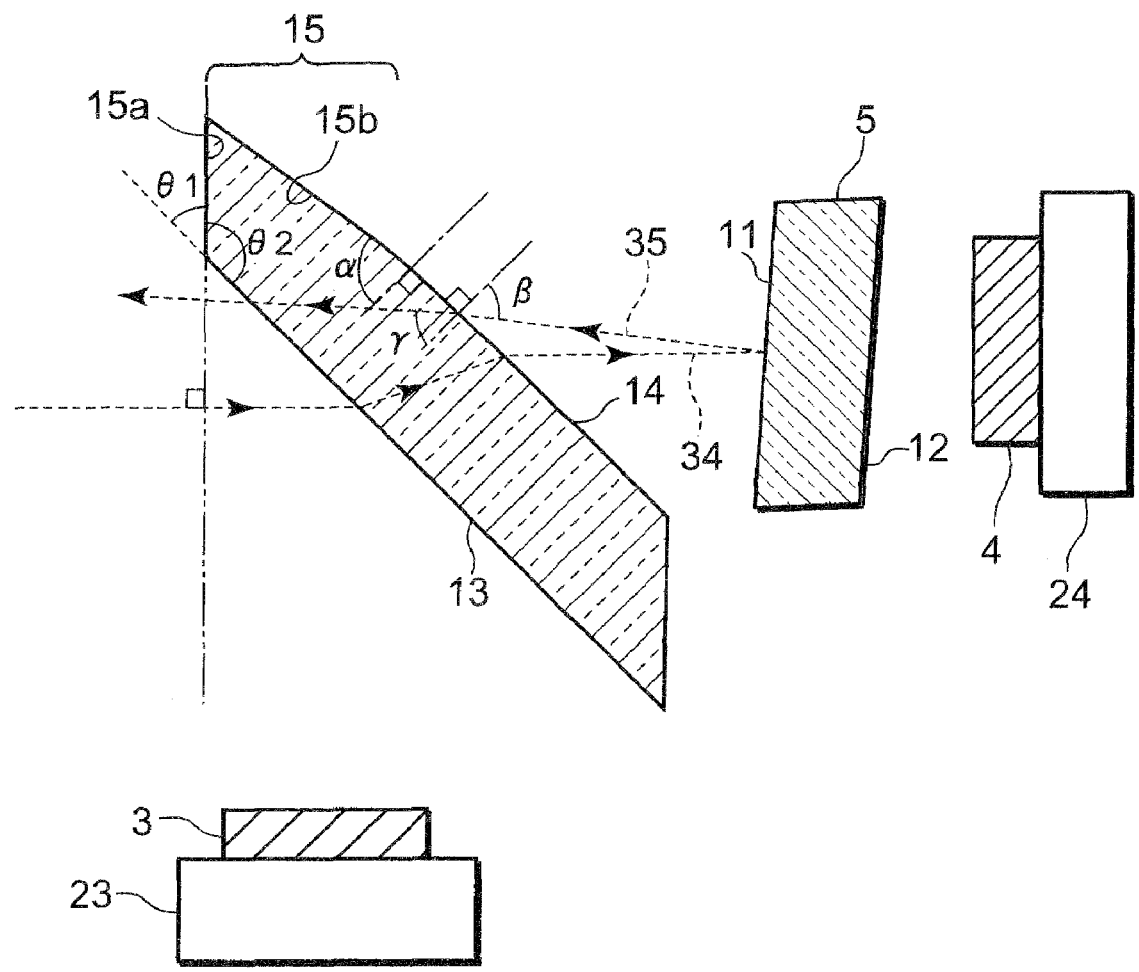
FIG. 6 is a cross-sectional view illustrating a configuration of a wavelength stabilizing unit according to a second embodiment of the present invention.

Now, a second embodiment of the present invention will be described below with reference to the accompanying drawing. FIG. 6 is a cross-sectional view illustrating a configuration of a wavelength stabilizing unit 26 of the second embodiment. The wavelength stabilizing unit 26 of the second embodiment includes a beam splitter plate 2 having a different configuration from the first embodiment. Referring to FIG. 6, a beam splitter plate end portion 15 of the beam splitter plate 2 of the second embodiment includes a first end portion 15a and a second end portion 15b.

The beam splitter plate 2 of the second embodiment is designed such that an angle of a first beam splitter plate surface 13 relative to a reference plane 37 is formed into a first layout angle θ1. As shown in FIG. 6, the first end portion 15a is rendered parallel to the reference plane 37. Accordingly, an angle between the first end portion 15a of the beam splitter plate 2 and the first beam splitter plate surface 13 is defined as a second layout angle θ2 (180°−the first layout angle θ1). Meanwhile, the second end portion 15b is configured to define a first angle α with a perpendicular plane to the second beam splitter plate surface 14.

Here, assuming that an incident angle of reflected light 35 reflected by a first filter surface 11 of a filter 5 entering a second beam splitter plate surface 14 of the beam splitter plate 2 is a second angle β and an exit angle of reflected light 35 reflected by the first filter surface 11 of the filter 5 exiting from the first beam splitter plate surface 13 is a third angle γ, the beam splitter plate 2 is configured to satisfy γ>θ1 and γ<α≦90°.

In this way, the beam splitter plate 2 of the second embodiment outputs the reflected light 35 supplied from the first filter surface 11 of the filter 5 to a different direction from the direction where a first photoelectric conversion element 3 is located as similar to the beam splitter plate 2 of the first embodiment. Accordingly, it is possible to suppress the reflected light toward the first photoelectric conversion element 3 for optical output monitoring and thereby to stabilize an optical output monitoring current.

Third Embodiment

Figure 7:
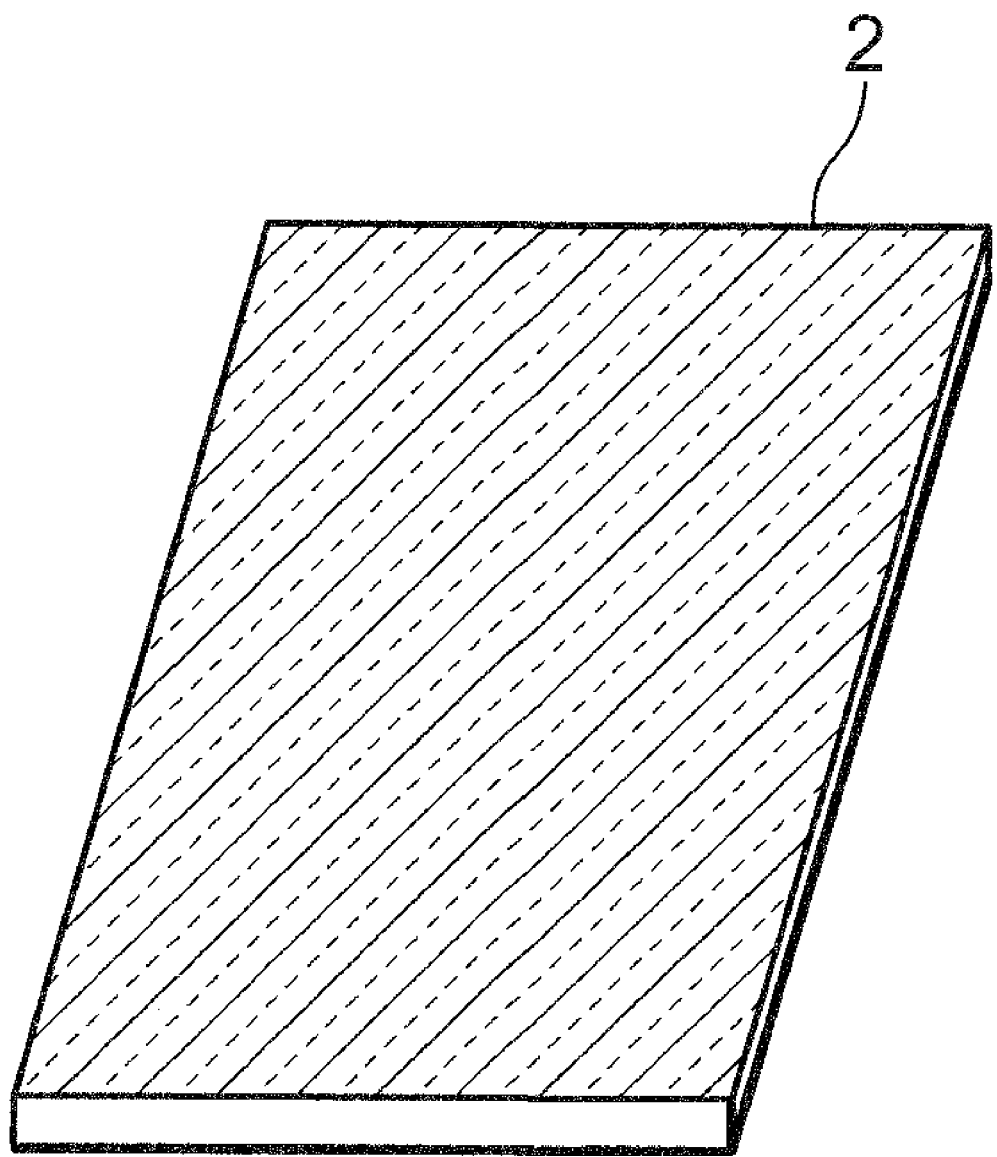
FIG. 7 is a perspective view illustrating a configuration of a beam splitter plate according to a third embodiment of the present invention.

Now, a third embodiment of the present invention will be described below with reference to the accompanying drawings. FIG. 7 is a perspective view illustrating a configuration of a beam splitter plate 2 according to the third embodiment of the present invention. Referring to FIG. 7, the beam splitter plate 2 of the third embodiment is substantially formed of a rectangular parallelepiped.

Figure 8:
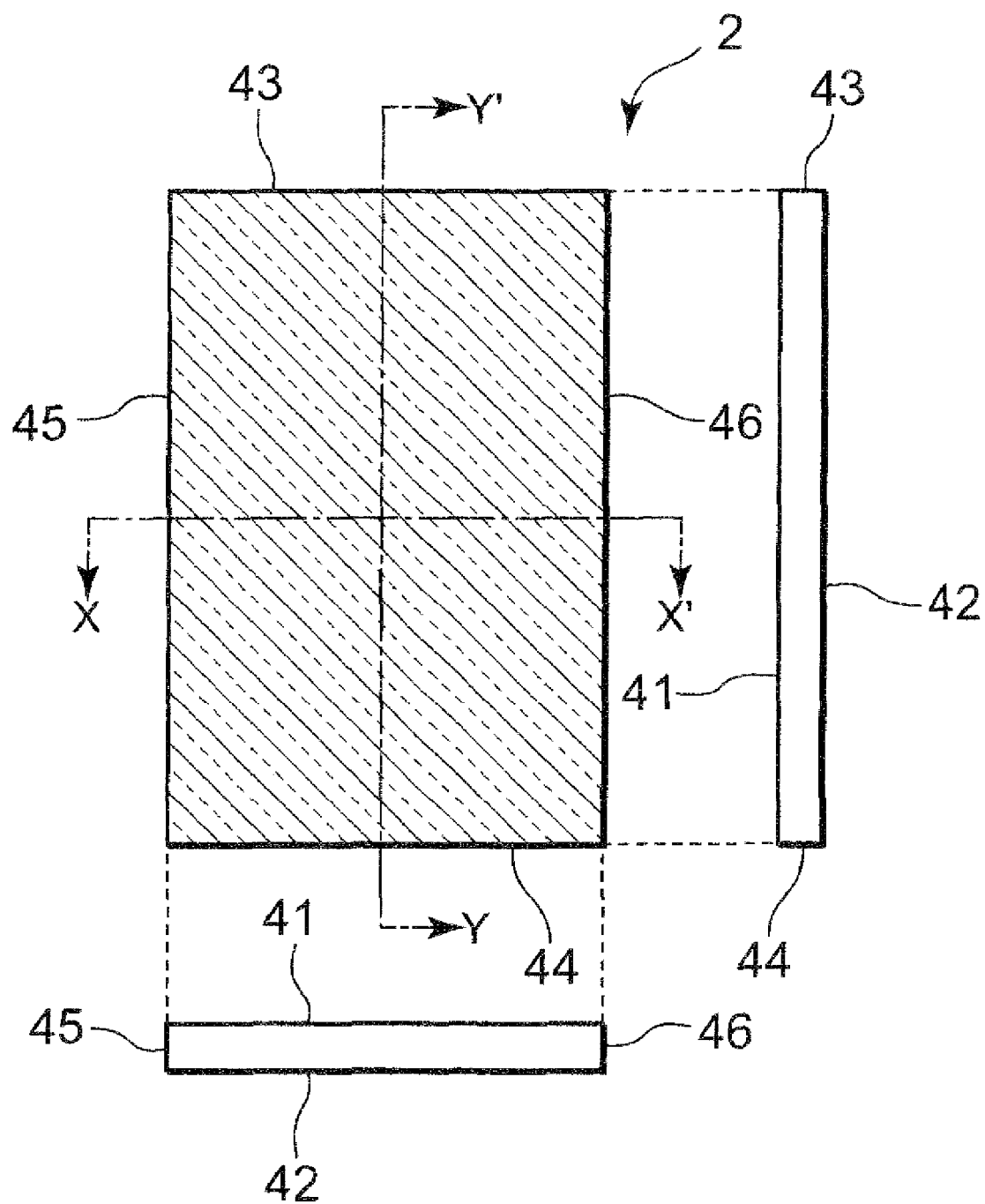
FIG. 8 is a three orthographic view illustrating the configuration of the beam splitter plate of the third embodiment.

FIG. 8 is a three orthographic view for illustrating the configuration of the beam splitter plate 2 of the third embodiment. Referring to FIG. 8, the beam splitter plate 2 of the third embodiment includes a first beam splitter plate surface 41, a second beam splitter plate surface 42, a first side surface 43, a second side surface 44, a third side surface 45, and a fourth side surface 46. When the beam splitter plate 2 of this embodiment is provided on an optical transmitter module 10, the first beam splitter plate surface 41 constitutes a light-receiving surface for receiving collimating backward outgoing light 36. The first beam splitter plate surface 41 reflects the collimating backward outgoing light 36 and outputs split light 33. Simultaneously, the first beam splitter plate surface 41 transmits the collimating backward outgoing light 36 therethrough and supplies the collimating backward outgoing light 36 to the second beams splitter plate surface 42. Therefore, the second beam splitter plate surface 42 constitutes a surface for outputting the transmitted light 34 in this case.

FIGS. 9A and 9B are cross-sectional views illustrating cross sections of the beam splitter plate 2 of the third embodiment. FIG. 9A illustrates the cross section taken along X-X' line in FIG. 8. Meanwhile, FIG. 9B illustrates the cross section taken along Y-Y' line in FIG. 8. Referring to FIGS. 9A and 9B, the beam splitter 2 of the third embodiment includes transmitted light surfaces 47 on side surface regions (a first region 51 to a fourth region 54) corresponding to the first beam splitter plate surface 41 (or the second beam splitter plate surface 42).

Figure 10:
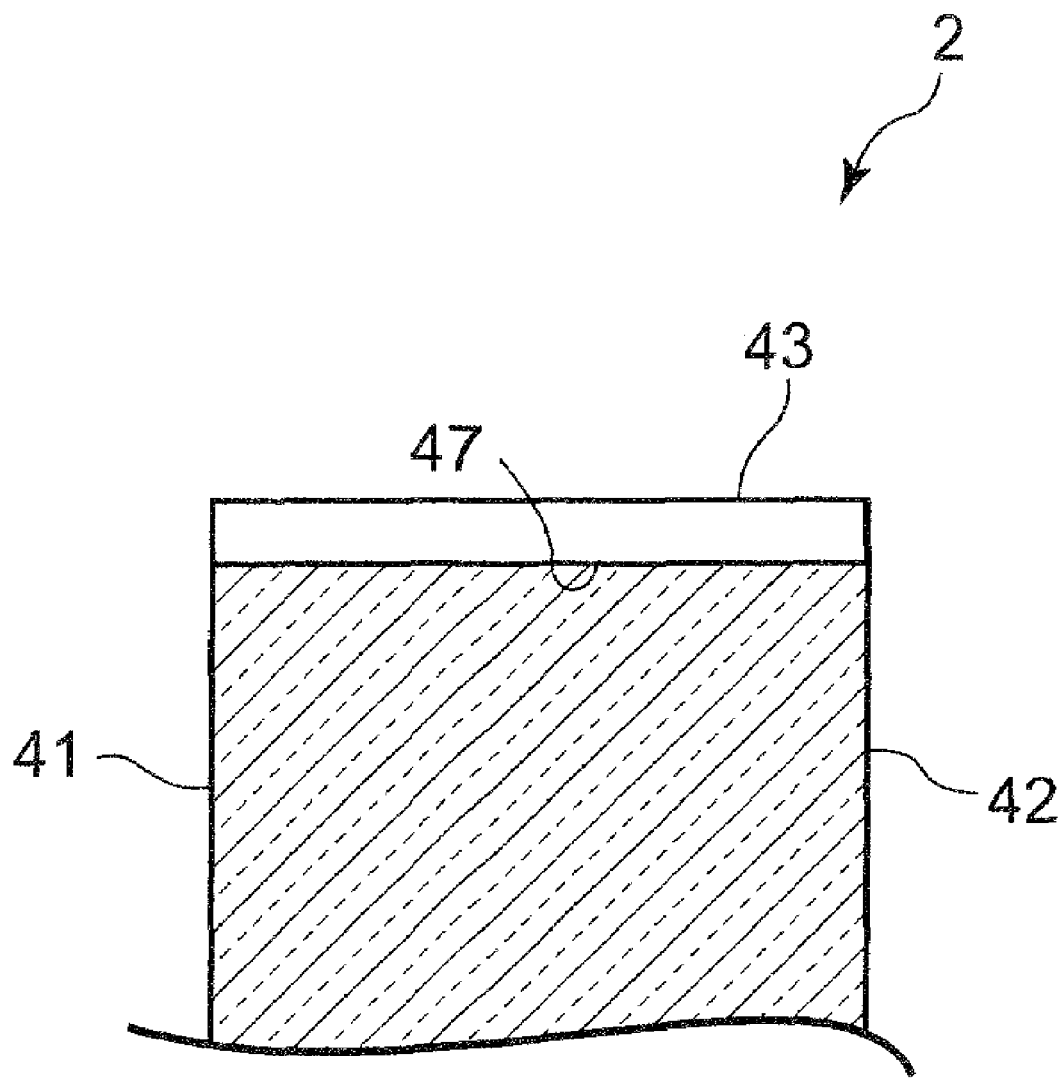
FIG. 10 is a cross-sectional view illustrating a configuration of a first region in the cross section of the third embodiment.

Now, details of the side surface regions (the first region 51 to the fourth region 54) of the third embodiment will be described with reference to the accompanying drawing. Since the respective side surface regions substantially have the same configuration, the following explanation will be made concerning the first region 51. FIG. 10 is a cross-sectional view illustrating a configuration of the first region 51 in the cross section of the third embodiment. Referring to FIG. 10, the transmitted light light-receiving surface 47 corresponding to the first side surface 43 is provided in the first region 51. This transmitted light light-receiving surfaces 47 is formed by adhering a coating film such as a titanium oxide film (a $TiO_2$ film), a silicon oxide film (a $SiO_2$ film) or a multilayered film containing these films. These films function as non-reflective films.

The beam splitter plate 2 of the third embodiment suppresses supply of reflected light 35 to a first photoelectric conversion element 3 for optical output monitoring by using a function of the transmitted light light-receiving surfaces 47 provided on the side surface thereof even when the reflected light 35 is irradiated from a filter 5 onto the side end surfaces (the first side surface 43 to the fourth side surface 46) of the beam splitter plate 2. In this way, the beam splitter plate 2 of the third embodiment can drastically reduce the stray light such as the light 136 in the conventional example, and thereby to stabilize an optical output monitoring current without conducting a grinding process, for example.

In the third embodiment, in addition to the above-described transmitted light light-receiving surfaces 47, it is also possible to form the transmitted light light-receiving surfaces 47 by blackening the side end surfaces in accordance with a black alumite treatment, for example.

Fourth Embodiment

Now, a fourth embodiment of the present invention will be described below with reference to the accompanying drawings. Note that a configuration of a beam splitter plate 2 of the fourth embodiment is substantially the same as the beam splitter plate 2 illustrated in FIG. 8. Respective side surfaces (a first side surface 43 to a fourth side surface 46) of the beam splitter plate 2 of this embodiment have a function to scatter light which is transmitted through the beam splitter plate 2. FIGS. 11A and 11B are cross-sectional views illustrating cross sections of the beam splitter plate 2 of the fourth embodiment. FIG. 11A illustrates the cross section taken along X-X' line of the beam splitter plate 2 illustrated in FIG. 8 corresponds to the fourth embodiment. Similarly, FIG. 11B illustrates the cross section taken along Y-Y' line of the beam splitter plate 2 illustrated in FIG. 8 corresponds to the fourth embodiment. Referring to FIGS. 11A and 11B, the beam splitter 2 of the fourth embodiment includes transmitted light light-receiving surfaces 47 on side surface regions (a first region 51 to a fourth region 54) corresponding to a first beam splitter plate surface 41 (or a second beam splitter plate surface 42), which are configured to scatter the light transmitted through the beam splitter plate 2.

Figure 12:
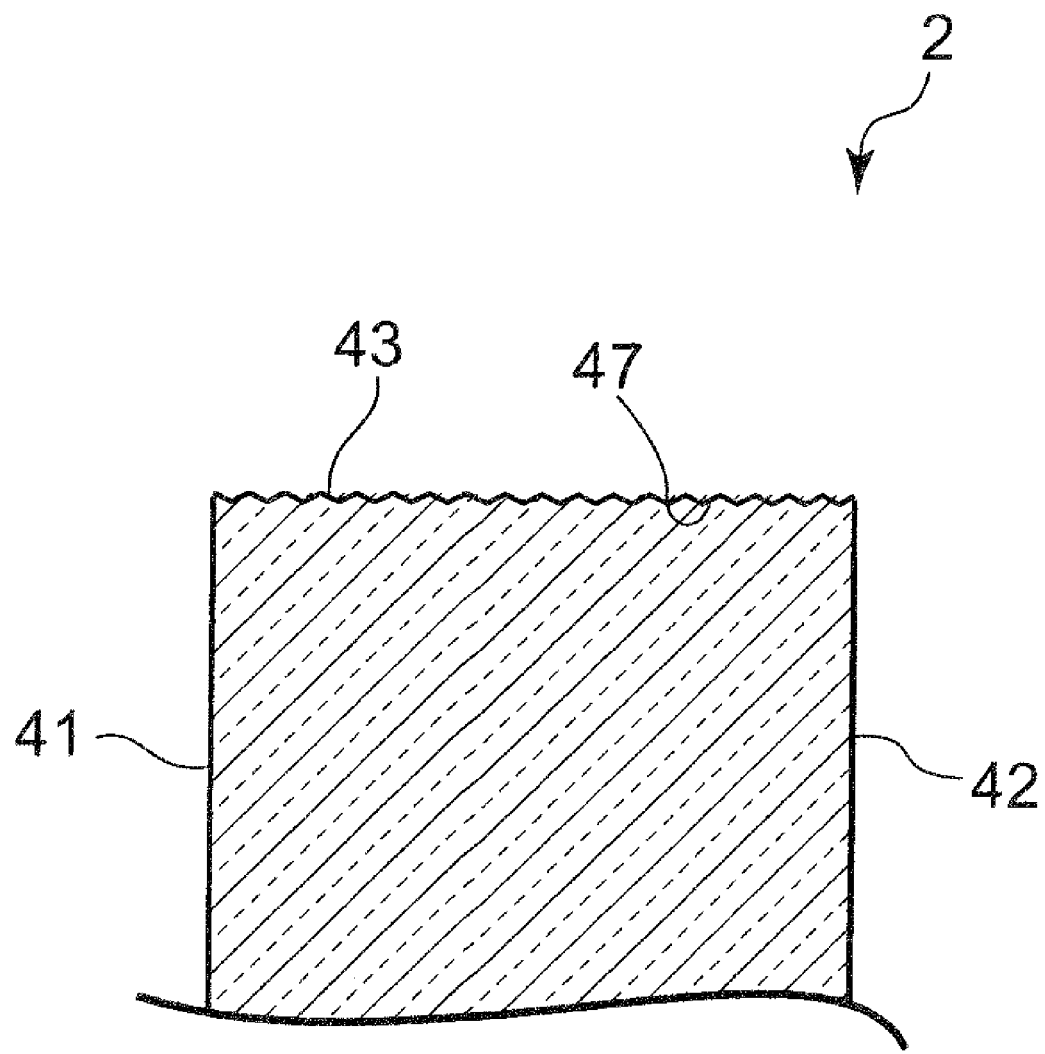
FIG. 12 is a cross-sectional view illustrating a configuration of a first region in the cross section of the fourth embodiment.

Now, details of the side surface regions (the first region 51 to the fourth region 54) of the fourth embodiment will be described with reference to the accompanying drawing. Since the respective side surface regions substantially have the same configuration, the following explanation will be made concerning the first region 51. FIG. 12 is a cross-sectional view illustrating a configuration of the first region 51 in the cross section of the fourth embodiment. Referring to FIG. 12, the transmitted light light-receiving surface 47 is formed on the first side surface 43 by a surface roughening process. The surface roughening process to be carried out for the side surface regions (the first region 51 to the fourth region 54) of the beam splitter plate 2 may be a sandblast process, for example. As similar to the beam splitter plate 2 of the third embodiment, the beam splitter plate 2 of the fourth embodiment suppresses the supply of reflected light 35 to a first photoelectric conversion element 3 for optical output monitoring by using a function of the transmitted light light-receiving surfaces 47 provided on the side surface thereof even when the reflected light 35 is irradiated from a filter 5 onto the side end surfaces (the first side surface 43 to the fourth side surface 46) of the beam splitter plate 2. In this way, the beam splitter plate 2 of the fourth embodiment can drastically reduce the stray light such as the light 136 in the conventional example, and thereby to stabilize an optical output monitoring current without a grinding process, or the like.

The third embodiment and the fourth embodiment show the configuration to coat the film working as the non-reflective film and the configuration of performing the surface roughening process on the entire circumference of the side end surfaces of the beam splitter plate 2. However, the transmitted light light-receiving surface 47 of any of these embodiments is not limited to these configurations. The beam splitter plate 2 according to any of these embodiments only needs to include the transmitted light light-receiving surface 47 having the above-described configuration at least in the region where the light is irradiated.

It is apparent that the present invention is not limited to the above embodiments, but may be modified and changed without departing from the scope and spirit of the invention.

What is claimed is:

1. An optical transmitter module comprising:
   a semiconductor laser configured to output forward outgoing light and backward outgoing light;
   a temperature control device configured to control a temperature of the semiconductor laser;
   a beam splitter plate configured to receive the backward outgoing light and to output split light which is reflected part of the backward outgoing light and transmitted light which is transmitted part of the backward outgoing light;
   a first photoelectric conversion element configured to convert the split light into an electric signal;
   a wavelength filter configured to receive the transmitted light and to change transmittance continuously depending on the wavelength of the transmitted light; and
   a second photoelectric conversion element configured to receive filter-transmitted light transmitted through the wavelength filter and to convert the filter-transmitted light into an electric signal,
   wherein the beam splitter plate includes an anti-stray-light structure configured to prevent the transmitted light reflected by an incident surface of the wavelength filter from entering the first photoelectric conversion element through a side end surface portion of the beam splitter plate, and
   wherein the anti-stray-light structure has a configuration in which an angle between the side end surface of the beam splitter plate and a plane perpendicular to a light-exit surface of the beam splitter plate is greater than a light-exit angle from the beam splitter plate which the reflected light from the filter enters.

2. The optical transmitter module according to claim 1, further comprising:
   a beam collimating element for converting the backward outgoing light into a collimating beam,
   wherein the beam splitter plate reflects and splits part of the collimating beam.

3. The optical transmitter module according to claim 2, wherein the beam collimating element is made of a lens.

4. The optical transmitter module according to claim 2, wherein the degree of parallelization of the collimating beam is within a range from 2 degrees negative to 2 degrees positive.

5. An optical transmitter module comprising:
   a semiconductor laser configured to output forward outgoing light and backward outgoing light;
   a temperature control device configured to control a temperature of the semiconductor laser;
   a beam splitter plate configured to receive the backward outgoing light and to output split light which is reflected part of the backward outgoing light and transmitted light which is transmitted part of the backward outgoing light;
   a first photoelectric conversion element configured to convert the split light into an electric signal;
   a wavelength filter configured to receive the transmitted light and to change transmittance continuously depending on the wavelength of the transmitted light; and
   a second photoelectric conversion element configured to receive filter-transmitted light transmitted through the wavelength filter and to convert the filter-transmitted light into an electric signal,
   wherein the beam splitter plate includes an anti-stray-light structure configured to prevent the transmitted light reflected by an incident surface of the wavelength filter from entering the first photoelectric conversion element through a side end surface portion of the beam splitter plate, and
   wherein the anti-stray-light structure has a configuration in which an angle between the side end surface of the beam splitter plate and a plane perpendicular to a light-exit surface of the beam splitter plate is greater than a light-exit angle from the beam splitter plate which the reflected light from the filter enters, and in which a part of the side end surface is disposed on a plane orthogonal to an optical axis.

6. An optical transmitter module comprising:
   a semiconductor laser configured to output forward outgoing light and backward outgoing light;
   a beam splitter plate configured to output split light which is reflected part of the backward outgoing light and transmitted light which is transmitted part of the backward outgoing light;
   a first photoelectric conversion element configured to receive the split light and to output a first signal obtained by converting the split light into an electric signal;
   a second photoelectric conversion element configured to receive the transmitted light and to output a second signal obtained by converting the transmitted light into an electric signal; and
   a wavelength filter disposed between the second photoelectric conversion element and the beam splitter plate, wherein the wavelength filter includes a first filter surface configured to receive the transmitted light and a second filter surface opposite to the first filter surface, the beam splitter plate includes:

a first beam splitter plate surface configured to receive the backward outgoing light;

a second beam splitter plate surface configured to output the transmitted light transmitted through the beam splitter plate; and an end portion located adjacent to both of the first beam splitter plate surface and the second splitter plate surface, and the end portion receives the reflected light reflected by the first filter surface through the second beam splitter plate surface, and suppresses retroreflection of the reflected light toward a light-receiving surface of the first photoelectric conversion element upon reception of the reflected light.

7. The optical transmitter module according to claim 6, wherein the end portion comprises a side end surface formed between the first beam splitter plate surface and the second beam splitter plate surface, and the side end surface is adjacent to the first beam splitter plate surface at such an angle that the reflected light would not be radiated onto the light-receiving surface of the first photoelectric conversion element.

8. The optical transmitter module according to claim 7, wherein the first beam splitter plate surface defines a first layout angle $\theta$ relative to a plane perpendicular to the optical axis of the backward outgoing light, and an angle $\alpha$ between the side end surface and the second beam splitter plate surface satisfies $\gamma<\alpha<90°$, where an exit angle of reflected light exiting from the first beam splitter plate surface is an angle $\gamma$.

9. The optical transmitter module according to claim 6, wherein the end portion comprises a side end surface, the side end surface includes a first end surface adjacent to the first beam splitter plate surface and a second end surface adjacent to the second beam splitter plate surface, the first end surface is adjacent to the first beam splitter plate surface at such an angle that the reflected light would not be radiated onto the light-receiving surface of the first photoelectric conversion element when outputting the retroreflection of the light by further reflecting the reflected light; and the second end surface is adjacent to the second beam splitter plate surface at such an angle that any of the reflected light and retroreflection of the reflected light would be radiated on the light-receiving surface of the first photoelectric conversion element.

10. The optical transmitter module according to claim 9, wherein the first beam splitter plate surface is configured to have a first layout angle $\theta 1$ relative to a plane perpendicular to an optical axis of the backward outgoing light, and to have a second layout angle $\theta=180°-\theta 1$ relative to the first end surface, and an angle $\alpha$ between the second end surface and the second beam splitter plate surface satisfies $\gamma>\theta 1$ and $\gamma<\alpha\leq 90°$, where an exit angle of reflected light exiting from the first beam splitter plate surface is an angle $\gamma$.

11. The optical transmitter module according to claim 6, wherein the end portion includes a film for suppressing retroreflection of the reflected light.

12. The optical transmitter module according to claim 11, wherein the film is made of any of a non-reflective film and a light-absorbing film.

13. The optical transmitter module according to claim 6, wherein the end portion comprises a roughened surface configured to receive the reflected light and to scatter the reflected light.

14. The optical transmitter module according to claim 6, further comprising a beam collimating element for converting the backward outgoing light into a collimating beam, wherein the beam splitter plate outputs the split light by reflecting part of the collimating beam.

15. The optical transmitter module according to claim 14, wherein the beam collimating element is an optical lens configured to output the collimating beam in response to the light emitted from the semiconductor laser.

16. The optical transmitter module according to claim 14, wherein the beam collimating element converts the backward outgoing light into the collimating beam so that the degree of parallelization would be within a range from 2 degrees negative to 2 degrees positive.

17. The optical transmitter module according to claim 5, further comprising:

a beam collimating element for converting the backward outgoing light into a collimating beam, wherein the beam splitter plate reflects and splits part of the collimating beam.

18. The optical transmitter module according to claim 5, wherein the beam collimating element is made of a lens.

19. The optical transmitter module according to claim 5, wherein the degree of parallelization of the collimating beam is within a range from 2 degrees negative to 2 degrees positive.

* * * * *